(12) United States Patent
Park

(10) Patent No.: US 9,230,644 B2
(45) Date of Patent: Jan. 5, 2016

(54) ELECTRONIC DEVICE

(71) Applicant: SK HYNIX INC., Icheon (KR)

(72) Inventor: Hae-Chan Park, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/454,688

(22) Filed: Aug. 7, 2014

(65) Prior Publication Data
US 2015/0310912 A1    Oct. 29, 2015

(30) Foreign Application Priority Data

Apr. 28, 2014 (KR) .......................... 10-2014-0050749

(51) Int. Cl.
G11C 11/00 (2006.01)
G11C 13/00 (2006.01)
(52) U.S. Cl.
CPC ........ *G11C 13/0069* (2013.01); *G11C 13/0004* (2013.01); *G11C 13/0011* (2013.01)
(58) Field of Classification Search
USPC .......................................................... 365/148
See application file for complete search history.

(56) References Cited

U.S. PATENT DOCUMENTS 8,289,763 B2 * 10/2012 Liu .................... G11C 5/025
                                                    365/148
9,059,395 B2 *  6/2015 Ju ...................... H01L 45/08
2008/0258129 A1 * 10/2008 Toda .................. G11C 11/56
                                                    257/5
2011/0063888 A1 *  3/2011 Chi .................... G11C 11/5685
                                                    365/148
2011/0261607 A1 * 10/2011 Tang .................. G11C 13/0007
                                                    365/148
2013/0121057 A1 *  5/2013 Le Neel ............ G11C 13/0069
                                                    365/148
2013/0203227 A1 *  8/2013 Huo ................... H01L 27/0688
                                                    438/238

FOREIGN PATENT DOCUMENTS

KR    10-2010-0136881 A    12/2010
KR    10-2012-0073435 A     7/2012

* cited by examiner

Primary Examiner — Hoai V Ho
Assistant Examiner — Pablo Huerta

(57) ABSTRACT

An electronic device includes semiconductor memory, which includes a memory cell block including first and second cell arrays and a column control block. The first cell array includes a word line, a first bit line, and a first variable resistance layer disposed between the word line and the first bit line. The second cell array includes the word line, a second bit line crossing the word line and the first bit line, and a second variable resistance layer disposed between the word line and the second bit line. The first and second variable resistance layers include different materials. The column control block supplies a first write bias for switching a resistance state of the first variable resistance layer to the first bit line and a second write bias for switching a resistance state of the second variable resistance layer to the second bit line.

19 Claims, 18 Drawing Sheets

# ELECTRONIC DEVICE

CROSS-REFERENCE TO RELATED APPLICATION

This patent document claims priority of Korean Patent Application No. 10-2014-0050749, entitled "ELECTRONIC DEVICE" and filed on Apr. 28, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can include a semiconductor memory where different variable resistance memory cells are integrally formed in one memory cell block.

In one aspect, an electronic device includes semiconductor memory, and the semiconductor memory includes a memory cell block including a first cell array and a second cell array, wherein the first cell array includes a word line, a first bit line crossing the word line and a first variable resistance layer interposed between the word line and the first bit line, and the second cell array includes the word line, a second bit line crossing the word line and the first bit line, and a second variable resistance layer interposed between the word line and the second bit line and formed of a material different from the first variable resistance layer; and a column control block configured to supply a first write bias required for switching of the first variable resistance layer to the first bit line and to supply a second write bias required for switching of the second variable resistance layer to the second bit line.

Implementations of the above electronic device may include one or more the following.

The word line extends in a first direction which is parallel to a surface of a substrate, the first bit line extends in a second direction which is parallel to the surface of the substrate and crosses the first direction, and is positioned at a level different from the word line in a third direction perpendicular to the surface of the substrate, and the second bit line extends in the third direction, and is positioned between a plurality of word lines which are at a same level in the third direction and between a plurality of first bit lines which are at a same level in the third direction. The first variable resistance layer includes a phase change material in which a resistance state is changed depending on a degree of crystallization, and the second variable resistance layer includes a metal oxide in which a resistance state is changed depending on creation or disappearance of a conductive path. The column control block is configured to simultaneously or selectively perform the supplying of the first write bias and the supplying of the second write bias. The first and second bit lines correspond to a first pair of first and second bit lines, and the column control block comprising: a column controller configured to output a set pulse or a reset pulse depending on data to be written to a memory cell; a first write driver including a first bias output unit configured to output the first write bias and a second bias output unit configured to output the second write bias, and configured to output one of the first write bias and the second write bias; a first memory selector configured to transfer an output of the column controller to one of the first bias output unit and the second bias output unit, between the column controller and the first write driver; and a first bit line selector configured to transfer an output of the first write driver to one of the first pair of first and second bit lines, between the first write driver and the memory cell block. The first memory selector includes a first switching element which controls a connection between the first bias output unit and the column controller and a second switching element which controls a connection between the second bias output unit and the column controller, and the first bit line selector includes a third switching element which controls a connection between the first write driver and the first bit line and a fourth switching element which controls a connection between the first write driver and the second bit line. A group of the first and third switching elements and another group of the second and fourth switching elements are selectively turned on. The memory cell block further comprises a second pair of first and second bit lines, the first bit line selector is configured to transfer the output of the first write driver to one of the second pair of first and second bit lines, and the output of the first write driver is transferred to the first bit lines of the first and second pairs or the second bit lines of the first and second pairs, selectively. The first bit line selector includes a first pair of third and fourth switching elements which control a connection between the first write driver and the first bit line of the first pair and a connection between the first write driver and the second bit line of the first pair, respectively, and a second pair of third and fourth switching elements which control a connection between the first write driver and the first bit line of the second pair and a connection between the first write driver and the second bit line of the second pair, respectively. The third switching elements of the first and second pairs are controlled together, and the fourth switching elements of the first and second pairs are controlled together. The memory cell block further comprises a second pair of first and second bit lines, and the column control block further comprising: a second write driver implemented in a same manner as the first write driver, a second memory selector configured to transfer the output of the column controller to one of a first bias output unit and a second bias output unit of the second write driver, between the column controller and the second write driver; and a second bit line selector configured to transfer an output of the second write driver to one of the second pair of first and second bit lines, between the second write driver and the memory cell block. The first bit line selector includes a first pair of third and fourth switching elements which control a connection between the first write driver and the first bit line of the first pair and a connection between the first write driver and the second bit line of the first pair, respectively, and the second bit line selector includes a second pair of third and fourth switching elements which control a connection between the second write driver and the first bit line of the second pair and a connection between the second write driver and the second bit line of the second pair, respectively. The third switching elements of the first and second pairs are controlled independently, and the fourth switching elements of the first and second pairs are controlled independently. The column control block comprising: a column controller configured to output a set pulse or a reset pulse depending on data to be written to a memory cell; a write driver configured to output the first write bias; a memory selector configured to transfer an output of the column controller to the write driver, between the column controller and the write driver; and a bit line selector configured to transfer the first write bias to the first bit line or transfer a modified first write bias to the second bit line, between the write driver and the memory cell block. The bit line selector includes a first transistor which controls a connection between the write driver and the first bit line, and a second transistor which controls a connection between the write driver and the second bit line, and a width of an active region of the first transistor is different from that of the second transistor. The memory cell block further includes a first selection element layer which interposed between the first variable resistance layer and the first bit line or between the first variable resistance layer and the word line, and controls whether a voltage or current is supplied to the first variable resistance layer or not. The memory cell block further includes a second selection element layer which interposed between the second variable resistance layer and the second bit line or between the second variable resistance layer and the word line, and controls whether a voltage or current is supplied to the second variable resistance layer or not. The semiconductor memory serves as a memory storing a user data when the first cell array is operated, and the semiconductor memory serves as a buffer memory for assisting an input-output of data of a memory when the second cell array is operated.

These and other aspects, implementations and associated advantages are described in greater detail in the drawings, the description and the claims.

DETAILED DESCRIPTION

Figure 1A:
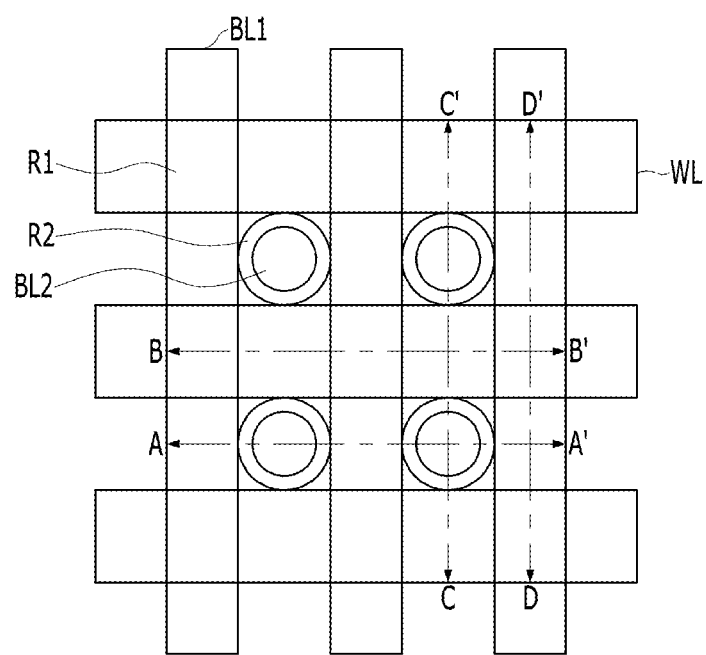
FIGS. 1A to 1E illustrate a memory cell block in accordance with an embodiment of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A variety of memories currently being developed may be used for different purposes depending on their characteristics. For example, since a dynamic random access memory (DRAM) is a volatile memory and requires a periodic refresh operation although it has a fast operation rate, it may be used for the purpose of storing data for executing software. Since a flash memory is a non-volatile memory and is capable of storing large-capacity data, it may be used for the purpose of storing user data. A variable resistance memory for storing data based on resistance changing characteristics, such as a resistive random access memory (RRAM), a phase-change random access memory (PRAM), a ferroelectric random access memory (FRAM), a magnetic random access memory (MRAM), and so on, may replace the DRAM or the flash memory, or may be used together with the DRAM or the flash memory according to desired characteristics.

Due to differences in the use of memories as described above, various electronic devices or systems may use many different types of memories together. A data storage system such as a memory card may include two or more high-capacity memories for storing large amounts of data. For example, a data storage system may include a first type of memory for storing large amounts of data and a second type of memory acting as a buffer memory for temporarily storing data in order to efficiently input and output data to and from the first type of memory. In the data storage system including both the memory for storing large amounts of data and the buffer memory, flash memory may be used as a high-capacity memory for storing large amounts of data, and DRAM may be used as a buffer memory.

When an electronic device or system includes various types of memories therein, each of the memories may be implemented as a separate individual memory cell block. This is because components of a first type of memory and methods of fabricating the first type of memory may be different from those of a second, different type of memory.

These differences may cause a variety of problems in terms of fabrication processes, costs, performance, the degree of integration, size, and so on.

Embodiments of the present disclosure provide a memory device in which different types of memory cells are formed in the same memory cell block, and a method for operating the memory device.

Figure 1B:
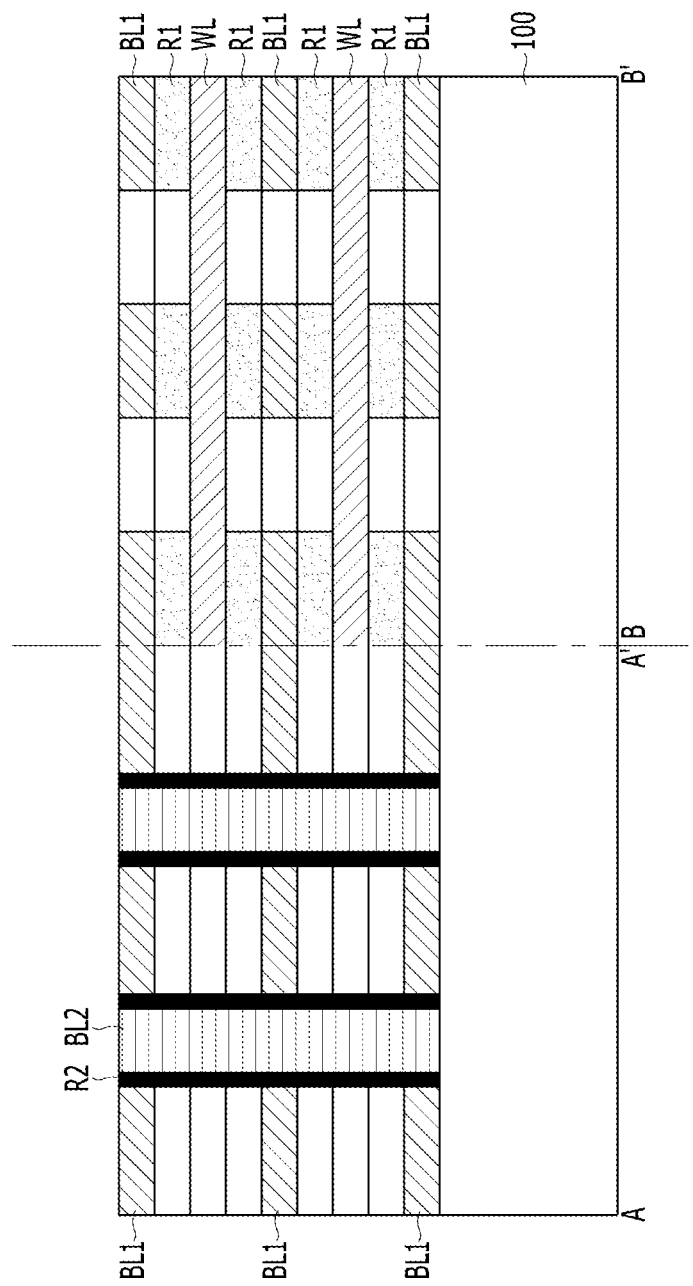
Figure 1C:
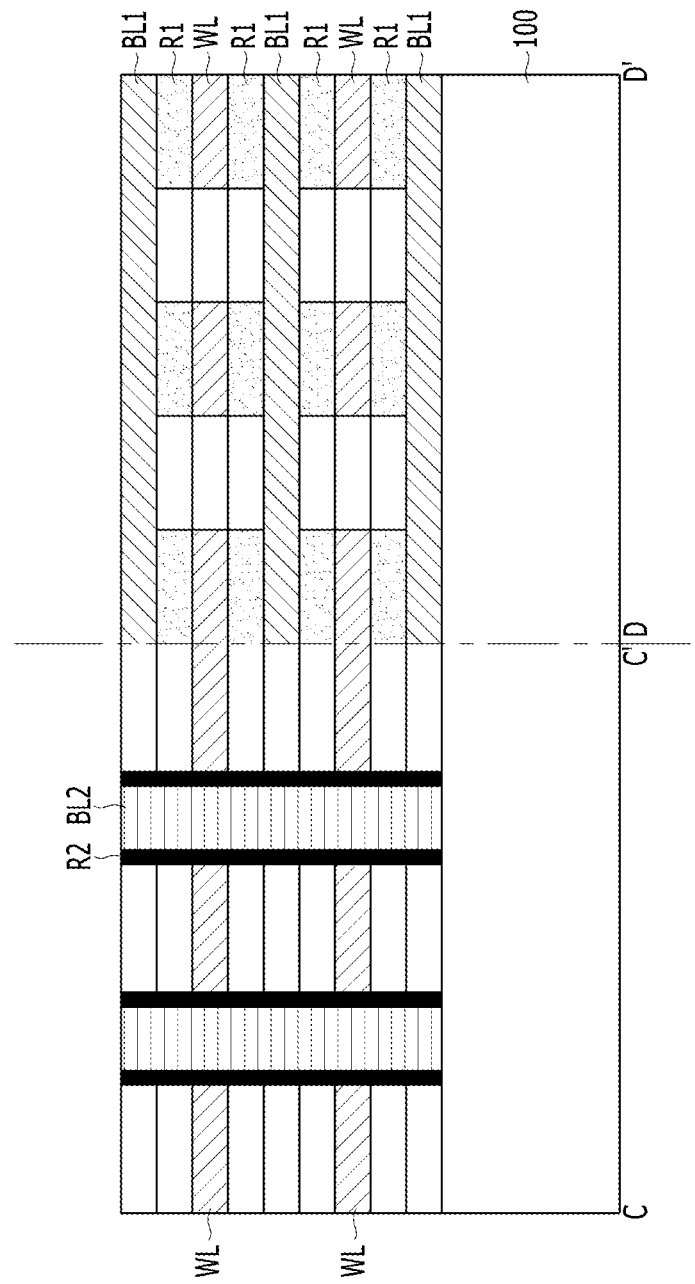
Figure 1D:
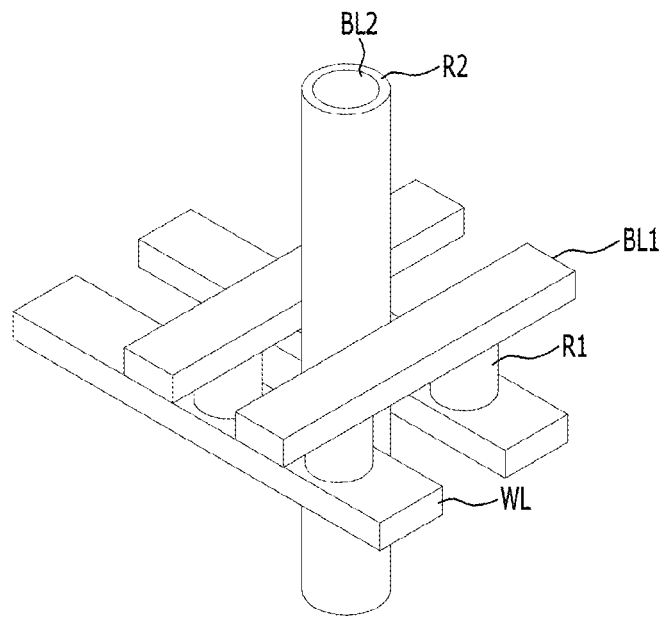
Figure 1E:
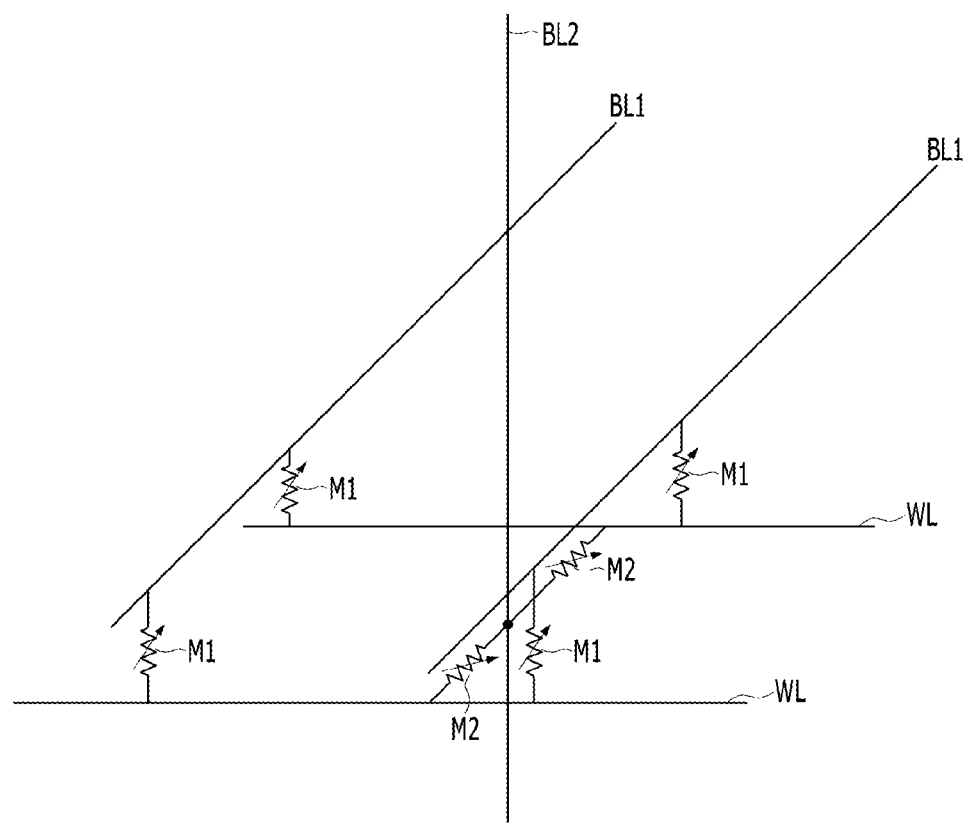

FIGS. 1A to 1E illustrate a memory cell block in accordance with an embodiment of the present disclosure. FIG. 1A is a plan view, FIG. 1B is a cross-sectional view taken along lines A-A' and B-B' of FIG. 1A, FIG. 1C is a cross-sectional view taken along lines C-C' and D-D' of FIG. 1A, FIG. 1D is a perspective view of the memory cell block shown in FIGS. 1A to 1C, and FIG. 1E is a circuit diagram of FIG. 1D.

Referring to FIGS. 1A to 1E, a substrate 100 including a predetermined structure (not shown) is provided. The memory cell block includes a word line WL, a first bit line BL1, and a first variable resistance layer R1 provided over the substrate 100. The word line WL extends in a first direction parallel to a surface of the substrate 100 and the first bit line BL1 extends in a second direction, which crosses the first direction and is parallel to the same surface of the substrate 100. The first variable resistance layer R1 is interposed between the word line WL and the first bit line BL1. The first bit line BL1 is positioned at a different level from the word line WL in a direction perpendicular to the surface of the substrate 100 (hereinafter, a vertical direction).

The word line WL and the first bit line BL1 serve to supply a voltage or current to the first variable resistance layer R1 interposed therebetween. The word line WL and the first bit line BL1 may be formed of various conductive materials. In an embodiment, the word line WL and the first bit line BL1 may have a single-layered structure or a multi-layered structure including a metal such as Pt, Ir, Ru, Al, Cu, W, Ti, Ta, Co, Ni, or the like, a metal nitride such as TiN, TiCN, TiAlN, TiON, TaN, TaCN, TaAlN, TaON, WN, MoN, or the like, or a combination thereof.

A plurality of word lines WL, which is positioned at the same level in the vertical direction, may be arrayed along the second direction and spaced apart from each other. A plurality of first bit lines BL1, which is positioned at the same level in the vertical direction, may be arrayed along the first direction and spaced apart from each other. A group of the word lines at the same level may be referred to as a word line plane, and a group of the first bit lines at the same level may be referred to as a first bit line plane. One or more word line planes and one or more first bit line planes may be alternately stacked in the vertical direction. One or more first variable resistance layers R1 are interposed between a word line plane and a first bit line plane.

FIGS. 1A to 1C illustrate three word lines WL included in each of the word line planes, three first bit lines BL1 included in each of the first bit line planes, and three first bit line planes and two word line planes which are alternately stacked. However, embodiments are not limited thereto. The number of word lines WL, first bit lines BL1, word line planes and first bit line planes may be changed in some embodiments.

The first variable resistance layer R1 may switch between different resistance states depending on a voltage or current applied thereto through the word line WL and the first bit line BL1. The first variable resistance layer R1 may have a single-layered structure or a multi-layered structure including any of variable resistance materials which are used in an RRAM, a PRAM, an FRAM, an MRAM, etc. The variable resistance materials may include a metal oxide such as a transition metal oxide or a perovskite-based material, a phase change material such as a chalcogenide-based material, a ferroelectric material, a ferromagnetic material, etc. In an embodiment, the first variable resistance layer R1 includes a phase change material. In an embodiment, the first variable resistance layer R1 may switch between a high resistance state corresponding to an amorphous state and a low resistance state corresponding to a crystalline state, depending on a voltage or current applied thereto. In another embodiment, the first variable resistance layer R1 may have three or more resistance states depending on a degree of crystallization of a phase change material. That is, the first variable resistance layer R1 may store three or more bits of data.

In an embodiment, the first variable resistance layer R1 has an island form in which it is disposed in an intersection region of the word line WL and the first bit line BL1, but embodiments are not limited thereto. In another embodiment, the first variable resistance layer R1 is in the form of a line overlapping with a word line WL or a first bit line BL1. In this embodiment, since a resistance change occurs in only the part of the first variable resistance layer R1 that is coupled to both the word line WL and the first bit line BL1, data may be stored in that part of the first variable resistance layer R1. That is, a memory cell may be formed in an intersection region of the word line WL and the first bit line BL1.

A structure including the word line WL, the first bit line BL1 and the first variable resistance layer R1 may be referred to as a first cell array. Also, a memory cell formed in an intersection region of the word line WL and the first bit line BL1 may be referred to as a first memory cell M1. Thus, to operate the first cell array, the word line and the first bit line BL1 are controlled.

The memory cell block further includes a second bit line BL2 and a second variable resistance layer R2 disposed over the substrate 100. The second bit line BL2 has a pillar shape extending in the vertical direction over the substrate 100 and is disposed in a vertical region defined by two adjacent word lines WL and two adjacent first bit lines BL1. That is, as shown in the plan view of FIG. 1A and the perspective view of FIG. 1D, two adjacent word lines WL define two opposing sides of the vertical region in which the second bit line BL2 is disposed, and two adjacent first bit lines BL1 define the other two opposing side of the vertical region. The second bit line BL2 passes through the vertical region, as shown in FIG. 1B. The second variable resistance layer R2 is disposed in the vertical region defined by the two adjacent word lines WL and the two adjacent first bit lines BL1, and surrounds sidewalls of the second bit line BL2.

Word lines WL defining the vertical region are in contact with the second variable resistance layer R2 surrounding the sidewall of the second bit line BL2. Therefore, the second bit line BL2 and the word line WL supply a voltage or current to the second variable resistance layer R2 interposed therebetween. Any one or both of the second bit line BL2 and the word line WL may be formed of a conductive material. A plurality of second bit lines BL2 may be arrayed in a matrix form. That is, in an embodiment, the second bit lines BL2 may be arranged in a plurality of rows extending in the first and second directions.

The second variable resistance layer R2 may switch between different resistance states depending on a voltage or current applied thereto through the word line WL and the second bit line BL2. The second variable resistance layer R2 may have a single-layered structure or a multi-layered structure including one of variable resistance materials which are used in an RRAM, a PRAM, an FRAM, an MRAM, etc. The variable resistance materials may include a metal oxide such as a transition metal oxide or a perovskite-based material, a phase change material such as a chalcogenide-based material, a ferroelectric material, a ferromagnetic material, etc.

In an embodiment, the second variable resistance layer R2 may be formed of a variable resistance material different from that of the first variable resistance layer R1. In an embodiment, the second variable resistance layer R2 may include a metal oxide. In this embodiment, the second variable resistance layer R2 may switch between a high resistance state, where a conductive path is created in the second variable resistance layer R2, and a low resistance state, where the conductive path in the second variable resistance layer R2 disappears. The conductive path may be formed by a movement of metal ions or oxygen vacancies of the metal oxide.

In an embodiment as illustrated in FIGS. 1A to 1C, the second variable resistance layer R2 forms a round shape surrounding the sidewalls of the second bit line BL2, but embodiments are not limited thereto. The second variable resistance layer R2 may have various shapes as long as the second variable resistance layer R2 is interposed between and coupled to the word line WL and the second bit line BL2.

In an embodiment, the second variable resistance layer R2 is in contact with the first bit line BL1. But, in another embodiment, the second variable resistance layer R2 may be separated from (i.e., may not be in contact with) the first bit line BL1. This is because a memory cell is formed in an intersection region of the word line WL and the second bit line BL2.

A structure including the word line WL, the second bit line BL2 and the second variable resistance layer R2 may be referred to as a second cell array. Also, a memory cell formed in an intersection region of the word line WL and the second bit line BL2 may be referred to as a second memory cell M2. Thus, to operate the second cell array, the word line and the second bit line BL2 are controlled.

In FIGS. 1B and 1C, parts which are not hatched and not marked with reference numerals may include interlayer dielectric layers.

In the above described embodiments, memory cells including different variable resistance materials, for example, the first memory cell M1 including a phase change material and the second memory cell M2 including a metal oxide, are formed in one memory cell block. Therefore, different types of memory cells can be disposed in one memory cell block, and it is possible to increase the degree of integration of a memory cell block and/or to reduce the size of the memory cell block. Also, fabrication processes of the memory cell block are simplified, and thus, it is possible to reduce fabrication costs since different substrates and/or different chips are not required to form different types of memories. Embodiments directed to the simplification of fabrication processes of a memory cell block will be described below with reference to FIGS. 2A and 2B and FIGS. 1A to 1C.

A peripheral circuit for operating the first and second cell arrays and a method for operating the cell arrays and the peripheral circuit will be described in subsequent paragraphs.

Figure 2A:
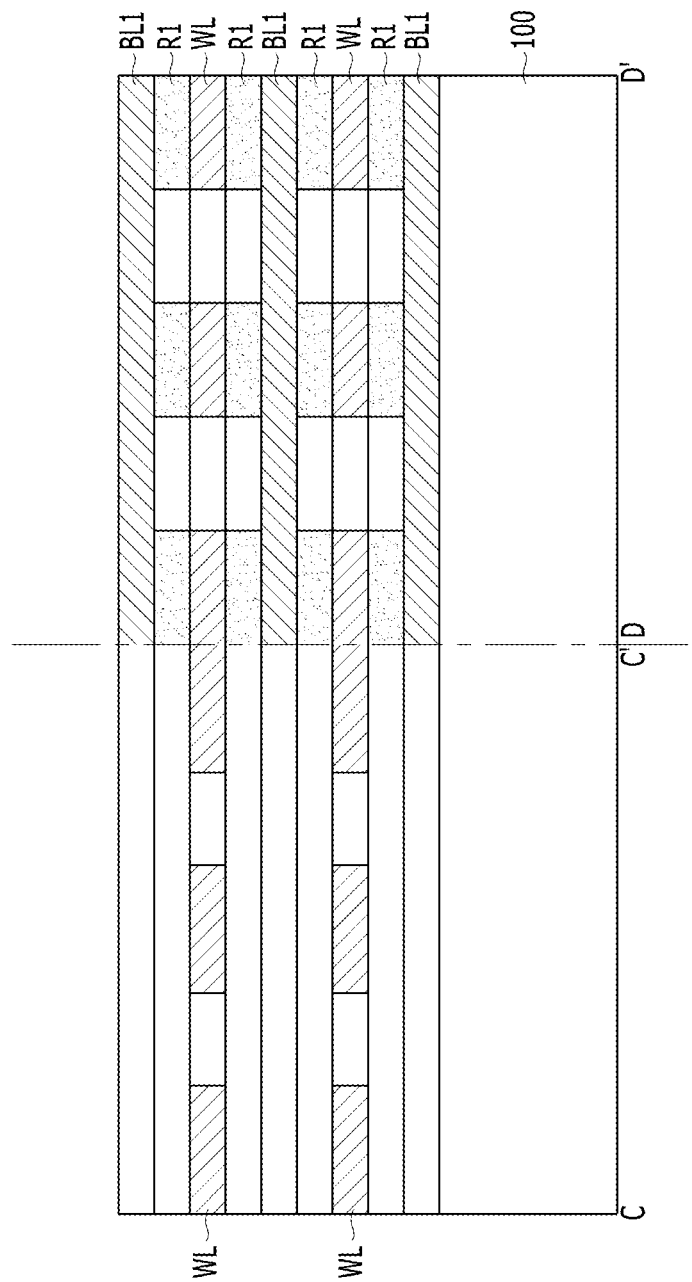
FIGS. 2A and 2B are cross-sectional views illustrating a method of fabricating the memory cell block of FIGS. 1A to 1E in accordance with an embodiment of the present disclosure.
Figure 2B:
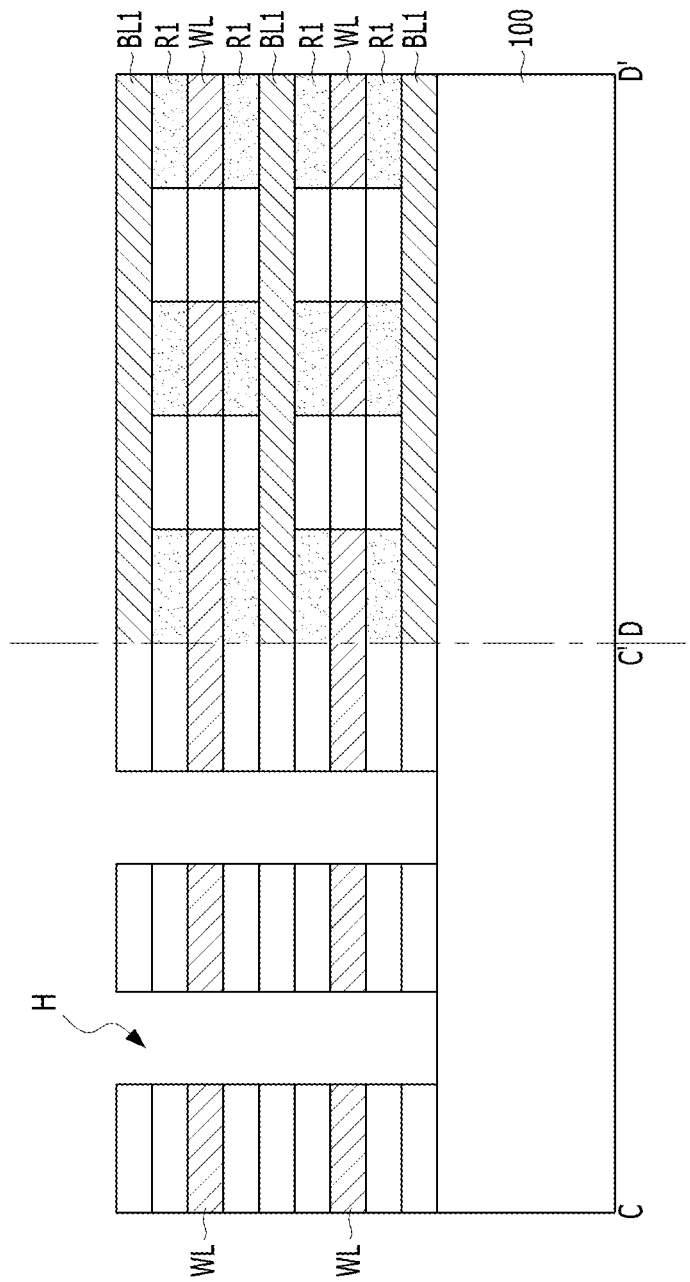

FIGS. 2A and 2B are cross-sectional views illustrating a method of fabricating the memory cell block of FIGS. 1A to 1E in accordance with an embodiment. FIGS. 2A and 2B show only intermediate processing steps for forming the memory cell block.

Referring to FIG. 2A, the first bit lines BL1, which extend in the second direction and are arrayed along the first direction, may be formed by depositing a conductive material layer over the substrate 100 and selectively etching the conductive material layer. A space between the first bit lines BL1 may be filled with an insulating material.

The first variable resistance layers R1, which have an island structure and thus are disposed in respective intersection regions of the first bit lines BL1 and the word lines WL, may be formed by depositing a first variable resistance material, for example, a phase change material, over the first bit lines BL1 and selectively etching the first variable resistance material layer. A space between the first variable resistance layers R1 may be filled with an insulating material.

The word lines WL, which extend in the first direction and are arrayed along the second direction, may be formed by depositing a conductive material layer over the first variable resistance layers R1 and selectively etching the conductive material layer. A space between the word lines WL may be filled with an insulating material.

The process of forming the first bit lines BL1 and the process of forming the word lines WL may be performed alternately and repeatedly. The process of forming the first variable resistance layers R1 may be performed between the process of forming the first bit lines BL1 and the process of forming the word lines WL. As a result, a stacked structure having alternating word lines WL and first bit lines BL1, with variable resistance layers disposed therebetween, as shown in FIG. 2A, is formed.

Referring to the plan view of FIG. 1A and the cross-sectional view of FIG. 2B, insulating materials filling a region defined by two adjacent word lines WL and two adjacent first bit lines BL1 may be selectively etched to form holes H which pass through the stacked structure and expose sidewalls of the word lines WL.

The holes H may provide spaces to form the second variable resistance layers R2 and the second bit lines BL2 therein. Sidewalls of the word lines WL, which are exposed by the holes H, may be disposed at sides of each hole H that are opposite to each other in the second direction. In some embodiments, sidewalls of the first bit lines BL1 may be exposed at opposite sides of each hole H in the first direction or may not be exposed by the holes H.

Referring again to FIG. 1C, a second variable resistance material, for example, a metal oxide, may be deposited along an entire surface of a resultant structure of FIG. 2B, and then a blanket etching process may be performed on the second variable resistance material layer. As a result, the second variable resistance layers R2 are formed over inner sidewalls of the holes H as illustrated in FIG. 1C.

Subsequently, the second bit lines BL2 having a pillar shape may be formed by filling the remainder of the space within the holes H in which the second variable resistance layers R2 are formed with a conductive material. As a result, sidewalls of the second bit lines BL2 are surrounded by the second variable resistance layers R2.

Figure 3:
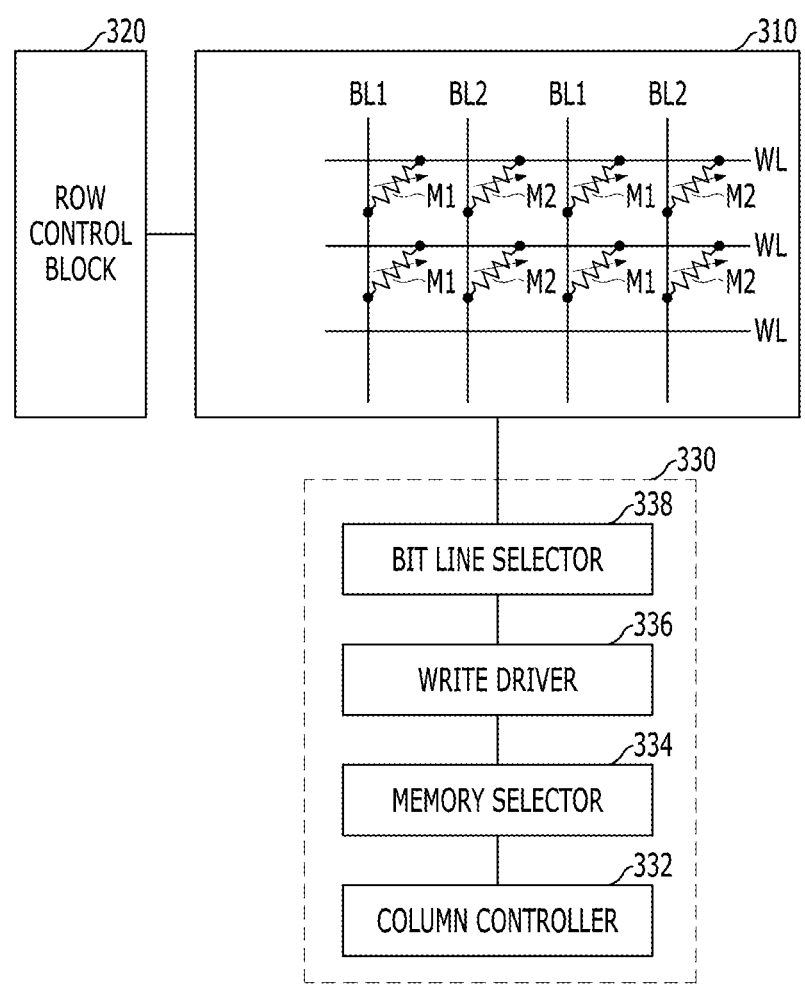
FIG. 3 illustrates a memory device in accordance with an embodiment of the present disclosure.

FIG. 3 illustrates a memory device in accordance with an embodiment of the present disclosure. The memory device includes a memory cell block 310 and a peripheral circuit for operating the memory cell block 310. The peripheral circuit includes a row control block 320 and a column control block 330.

The memory cell block 310 may include structures of FIGS. 1A to 1E. Therefore, the memory cell block 310 may include a first cell array including word lines WL, first bit lines BL1 crossing the word lines WL and first memory cells M1 disposed in intersection regions of the word lines WL and the first bit lines BL1, and a second cell array including the word lines WL, second bit lines BL2 crossing the word lines WL and second memory cells M2 disposed in intersection regions of the word lines WL and the second bit lines BL2.

The row control block 320 may select one of the word lines WL that is connected to a selected memory cell. For this, although not shown, the row control block 320 may include various circuits such as a row decoder, a row selector, and so on.

The column control block 330 may supply a write bias, that is, a write current or a write voltage, to one of the first and second bit lines BL1 and BL2 that is connected to the selected memory cell. If a first memory cell M1 is selected, the column control block 330 may supply the write bias to a first bit line BL1 coupled to the selected first memory cell M1. On the other hand, if a second memory cell M2 is selected, the column control block 330 may supply the write bias to a second bit line BL2 coupled to the selected second memory cell M2.

In an embodiment, the write bias may include a set bias, which changes a resistance state of the selected memory cell from a high resistance state to a low resistance state, and a reset bias, which changes the resistance state of the selected memory cell from the low resistance state to the high resistance state.

Since the first memory cell M1 and the second memory cell M2 have different structures from each other, set biases of the first and second memory cells M1 and M2 may be different from each other, and reset biases of the first and second memory cells M1 and M2 may be different from each other. A set bias and a reset bias used to switch a resistance state of the first memory cell M1 may be referred to as a first set bias and a first reset bias, respectively. Also, a set bias and a reset bias used to switch a resistance state of the second memory cell M2 may be referred to as a second set bias and a second reset bias, respectively.

The column control block 330 includes a column controller 332, a memory selector 334, a write driver 336 and a bit line selector 338.

The column controller 332 may determine data to be written into the selected memory cell. In an embodiment, the column controller 332 may supply a set pulse or a reset pulse to the write driver 336 via the memory selector 334 in response to an external command signal which commands to write one of a set data, e.g., '0' data, and a reset data, e.g., '1' data. That is, the column controller 332 may output the set pulse when data to be stored in the selected memory cell is '0' data, and may output the reset pulse when data to be stored in the selected memory cell is '1' data.

The write driver 336 may output the write bias to the selected memory cell. In an embodiment, the write driver 336 supplies a set bias or a reset bias to a selected bit line via the bit line selector 338 based on the set pulse or the reset pulse supplied from the column controller 332. Since the memory cell block 310 includes the first and second memory cells M1 and M2, which use different set and reset biases, the write driver 336 may output one of biases having various levels, for example, the first set bias, the first reset bias, the second set bias and the second reset bias.

The memory selector 334 may select one of the first and second cell arrays. The memory selector 334 may transfer the set pulse or the reset pulse outputted from the column controller 332 to the write driver 336. In an embodiment, the memory selector 334 transfers the set pulse or the reset pulse from the column controller 332 to a part of the write driver 336 in response to a certain command signal which selects one of the first and second cell arrays. As a result, the part of the write driver 336 is activated. If a signal for selecting the first cell array is inputted to the memory selector 334, the memory selector 334 transfers the set pulse or the reset pulse to a part of the write driver 336 which can output the first set bias or the first reset bias to the first cell array. On the other hand, if a signal for selecting the second cell array is inputted to the memory selector 334, the memory selector 334 transfers the set pulse or the reset pulse to a part of the write driver 336 which can output the second set bias or the second reset bias to the second cell array.

The bit line selector 338 may select a bit line to which the write bias is supplied. When the first set bias or the first reset bias is supplied from the write driver 336, the bit line selector 338 may select the first bit line BL1 to which the first set bias or the first reset bias is supplied. On the other hand, when the second set bias or the second reset bias is supplied from the write driver 336, the bit line selector 338 may select the second bit line BL2 to which the second set bias or the second reset bias is supplied. The selected bit line is coupled to the selected memory cell.

A configuration and operation of a column control block in accordance with an embodiment will be described with reference to FIGS. 4 through 8.

Figure 4:
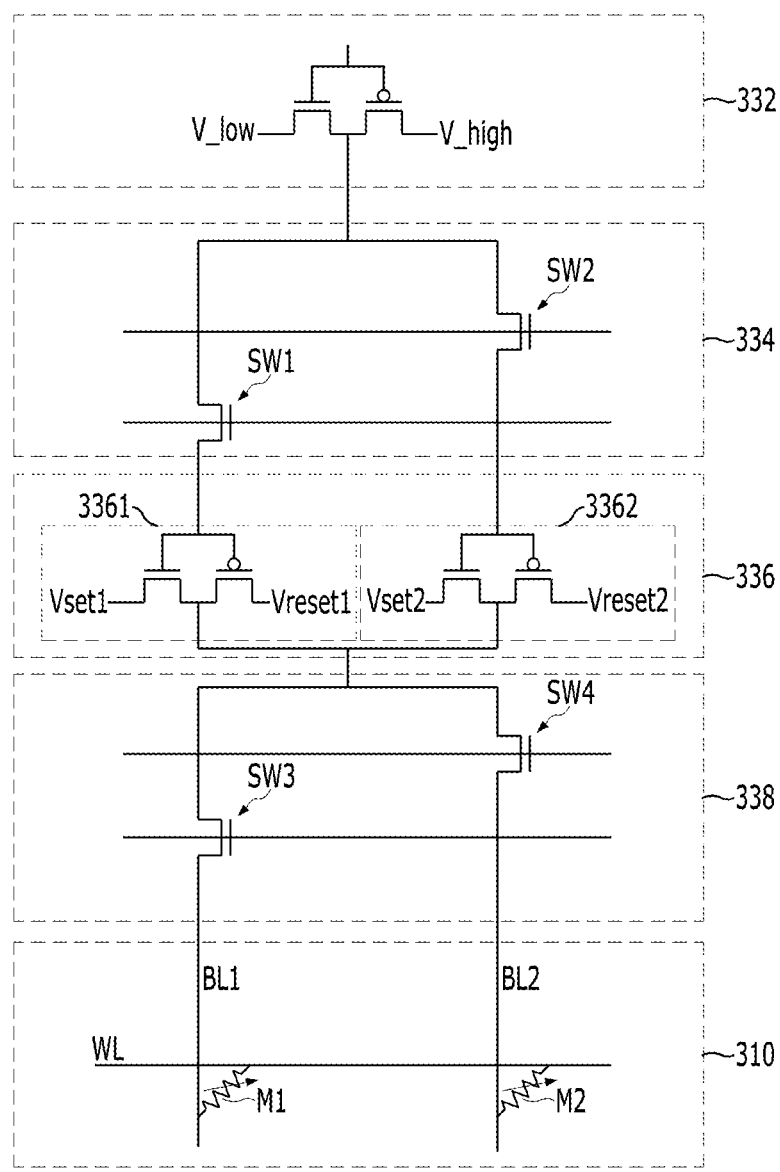
FIG. 4 illustrates a column control block in accordance with an embodiment of the present disclosure.

FIG. 4 illustrates a circuit diagram of a column control block 330 in accordance with a first embodiment of the present disclosure. For convenience of illustration, a part of the memory cell block 310, which includes one word line WL, a pair of first and second bit lines BL1 and BL2 crossing the word line WL and a pair of first and second memory cells M1 and M2, is shown together with the column control block 330.

Referring to FIG. 4, the column controller 332 includes a complementary metal-oxide semiconductor (CMOS) circuit. The CMOS circuit may selectively output a pulse of a high-voltage V_high, that is, a set pulse, or a pulse of a low-voltage V_low, that is, a reset pulse, depending on a voltage applied to an input node thereof in response to an external command signal. If write data is '0' data, a low voltage is applied to the input node of the CMOS circuit to turn on a PMOS transistor, thereby outputting the set pulse of the high-voltage V_high. On the other hand, if write data is '1' data, a high voltage is applied to the input node of the CMOS circuit to turn on an NMOS transistor, thereby outputting the reset pulse of the low-voltage V_low. In an embodiment, the high-voltage V_high is a power supply voltage, and the low-voltage V_low is a ground voltage, but embodiments are not limited thereto.

The memory selector 334 includes a first switching element SW1 and a second switching element SW2. Input nodes of the first and second switching elements SW1 and SW2 are connected to an output node of the column controller 332, and output nodes of the first and second switching elements SW1 and SW2 are connected to the write driver 336.

The first and second switching elements SW1 and SW2 may be selectively turned on in response to a command signal which selects one of the first and second cell arrays in the memory cell block 310. The first switching element SW1 is turned on when a memory cell in the first cell array is selected, and the second switching element SW2 is turned on when a memory cell in the second cell array is selected. The first and second switching elements SW1 and SW2 may include transistors.

The write driver 336 includes a first bias output unit 3361 and a second bias output unit 3362. The first bias output unit 3361 includes a CMOS circuit and selectively outputs a first set bias Vset1 or a first reset bias Vreset1 in response to the set pulse or the reset pulse supplied to an input node thereof via the memory selector 334. The second bias output unit 3362 includes a CMOS circuit and selectively outputs a second set bias Vset2 or a second reset bias Vreset2 in response to the set pulse or the reset pulse supplied to an input node thereof via the memory selector 334. The input node of the first bias output unit 3361 is connected to the first switching element SW1 of the memory selector 334. The input node of the second bias output unit 3362 is connected to the second switching element SW2 of the memory selector 334.

Output nodes of the first and second bias output units 3361 and 3362 are connected to a common node which is coupled to the bit line selector 338. As a result, the write driver 336 outputs to the common node one of the first set bias Vset1, the first reset bias Vreset1, the second set bias Vset2 and the second reset bias Vreset2, which is selected depending on which one of the first and second switching elements SW1 and SW2 is turned on.

The bit line selector 338 includes a third switching element SW3 and a fourth switching element SW4. Input nodes of the third and fourth switching elements SW3 and SW4 are connected to the common node. An output node of the third switching element SW3 is connected to a first bit line BL1, and an output node of the fourth switching element SW4 is connected to a second bit line BL2. The third and fourth switching elements SW3 and SW4 may be selectively turned on in response to a command signal which selects one of the first and second bit lines BL1 and BL2.

The third switching element SW3 is turned on when a memory cell coupled to the first bit line BL1 in the first cell array of the memory cell block 310 is selected, and transfers the first set bias Vset1 or the first reset bias Vreset1 to the first bit line BL1 depending on which of "0" data and "1" data is stored in the selected memory cell. The fourth switching element SW4 is turned on when a memory cell coupled to the second cell array of the memory cell block 310 is selected, and transfers the second set bias Vset2 or the second reset bias Vreset2 to the second bit line BL2 depending on which of "0" data and "1" data is stored in the selected memory cell. The third and fourth switching elements SW3 and SW4 may include transistors.

As a result of the above-described operations of the components of FIG. 4, a write bias is supplied to one of the pair of first and second memory cells M1 and M2 coupled to the first and second bit lines BL1 and BL2, respectively. The operations of the components of FIG. 4 will be described in more detail with reference to FIGS. 5A to 5D.

Figure 5A:
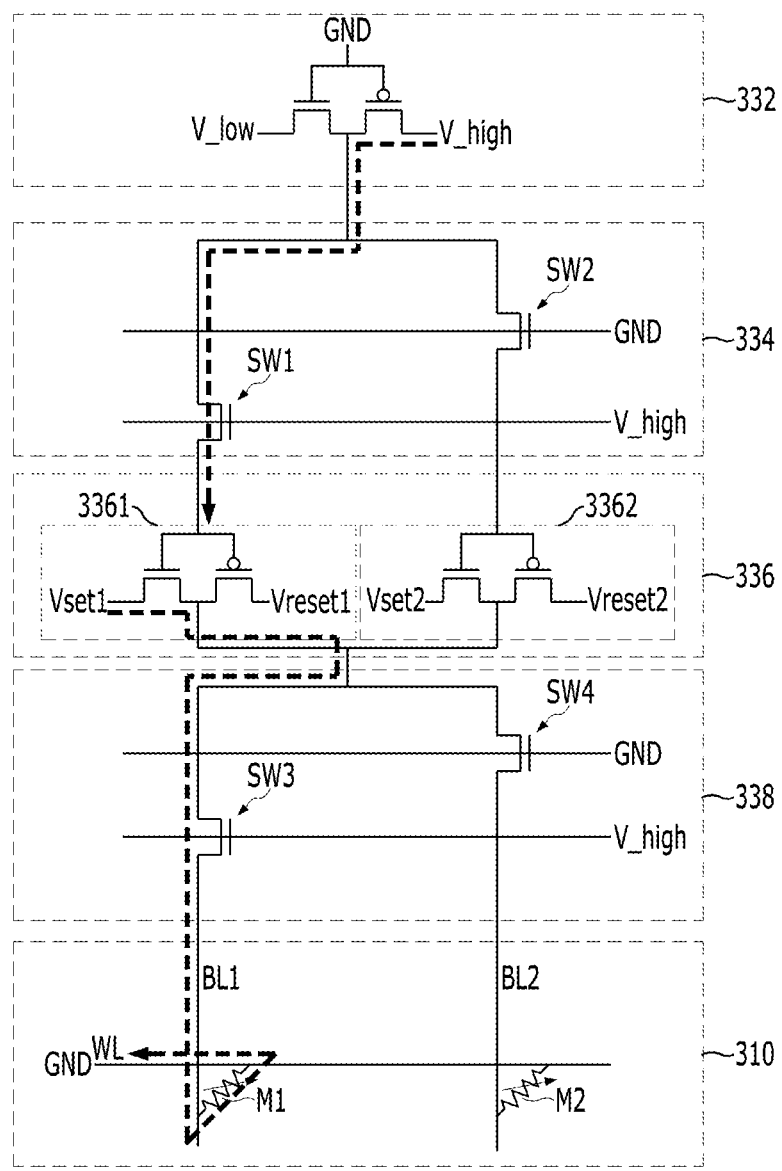
FIGS. 5A to 5D are views explaining a method of writing data using the column control block of FIG. 4.
Figure 5B:
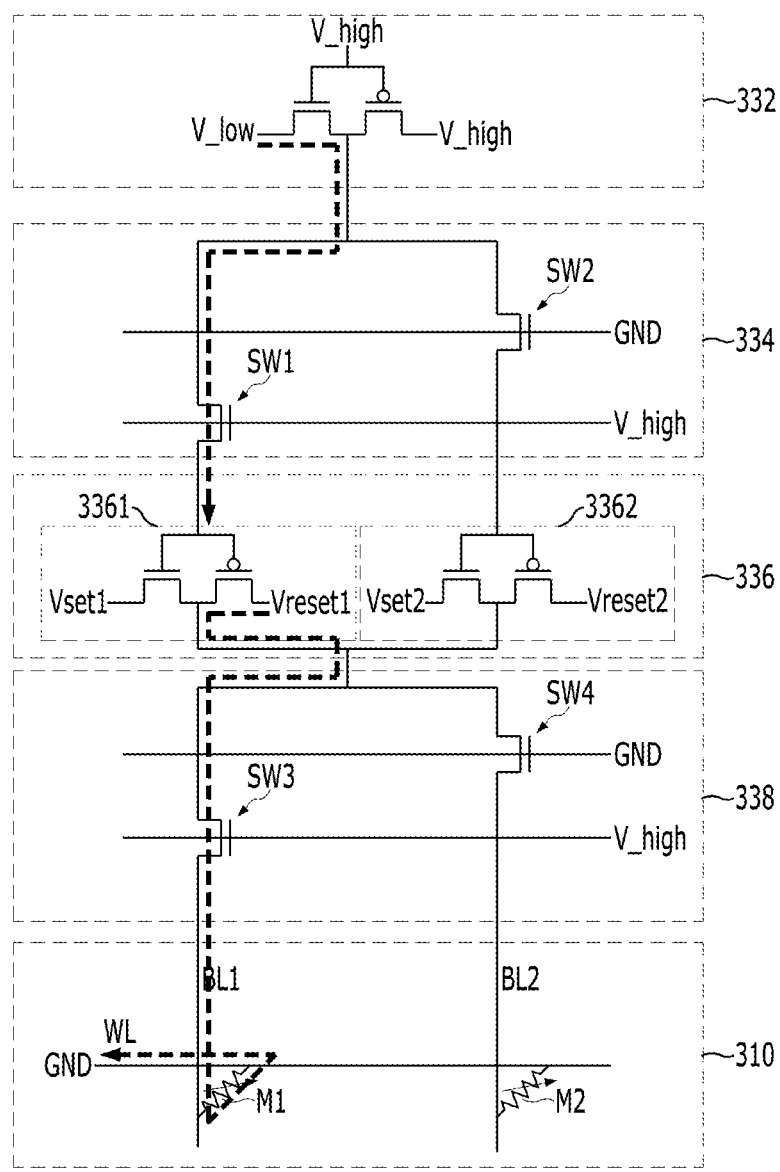
Figure 5C:
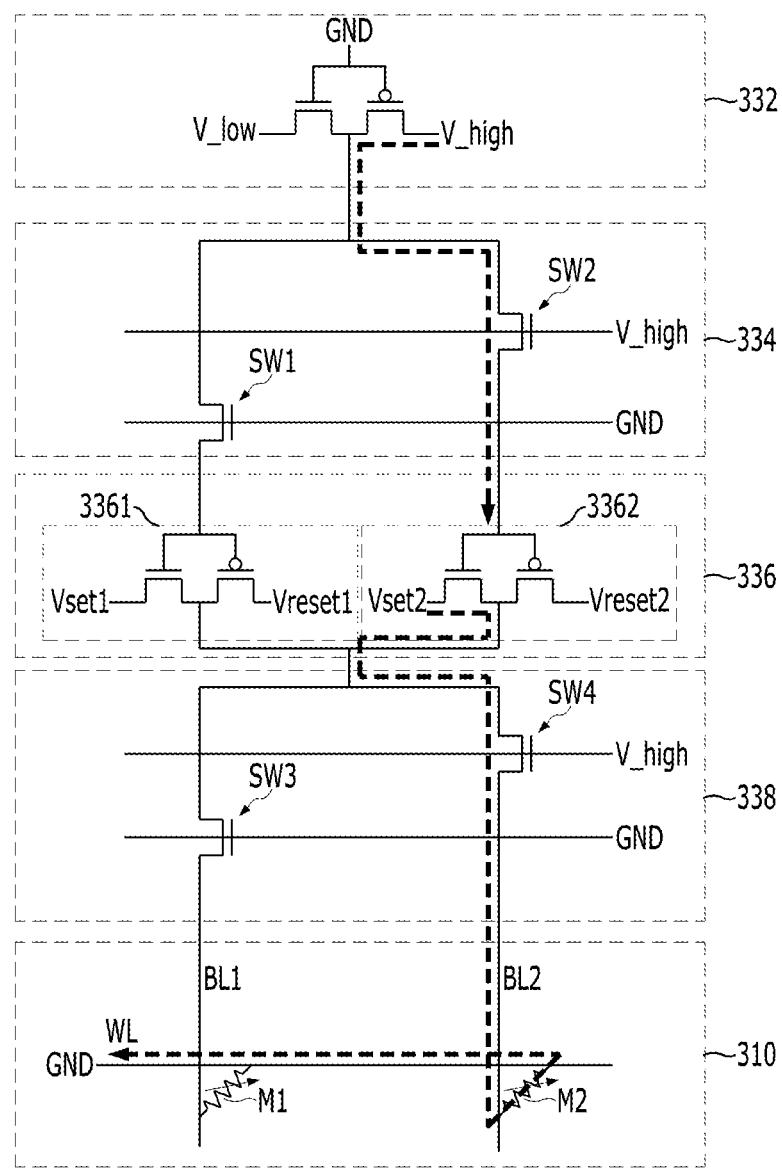
Figure 5D:
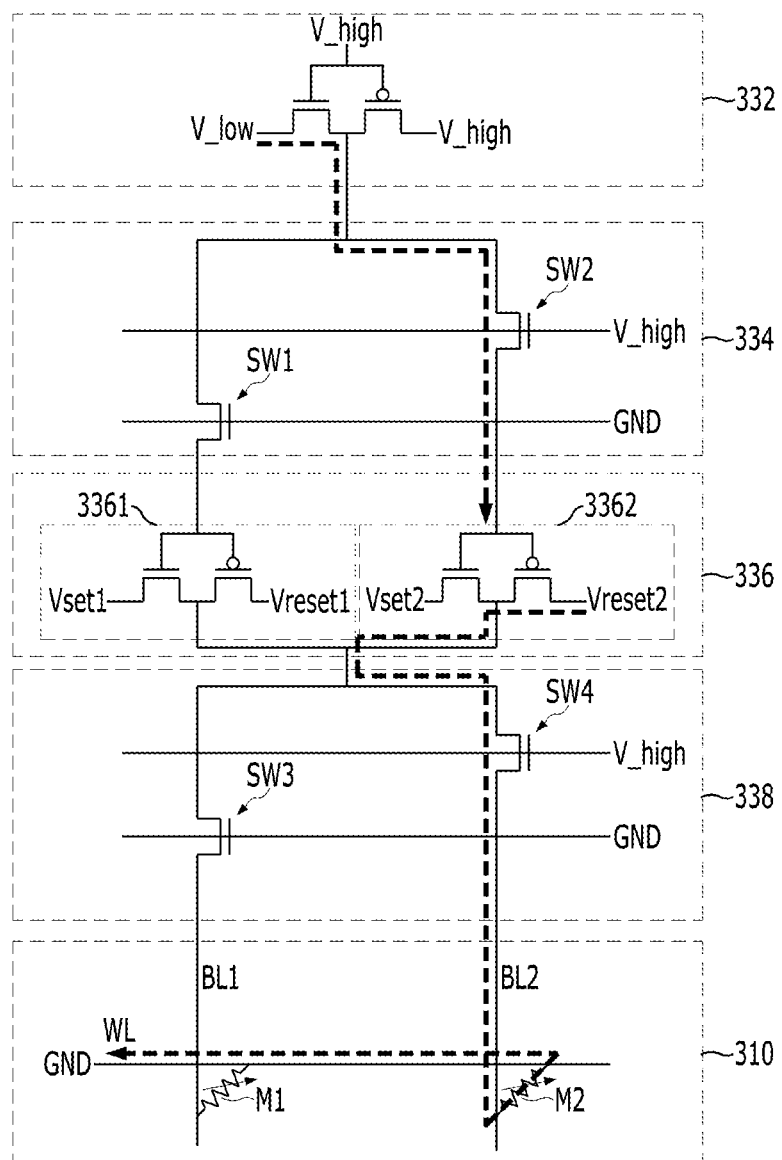

FIGS. 5A to 5D are views illustrating a method of writing data using the column control block of FIG. 4. FIG. 5A is a view illustrating a method of writing '0' data into the first memory cell M1. FIG. 5B is a view illustrating a method of writing '1' data into the first memory cell M1. FIG. 5C is a view illustrating a method of writing '0' data into the second memory cell M2. FIG. 5D is a view illustrating a method of writing '1' data into the second memory cell M2.

Referring to FIG. 5A, when a low voltage, for example, a ground voltage GND is applied to the input node of the CMOS circuit of the column controller 332 in response to a command signal for writing '0' data, the set pulse of a high voltage V_high is transferred to the memory selector 334.

The first switching element SW1 of the memory selector 334 is turned on and the second switching element SW2 of the memory selector 334 is turned off, in response to a command signal for operating the first cell array. For this, if the first and second switching elements SW1 and SW2 are NMOS transistors, the high voltage V_high is applied to a gate of the first switching element SW1, and a ground voltage GND is applied to a gate of the second switching element SW2. As a result, the set pulse transferred from the column controller 332 is transferred to the first bias output unit 3361 via the first switching element SW1.

When the high voltage V_high is applied to the input node of the CMOS circuit of the first bias output unit 3361, the NMOS transistor is turned on, and thus the first set bias Vset1 is transferred to the bit line selector 338.

The third switching element SW3 of the bit line selector 338 is turned on and the fourth switching element SW4 of the bit line selector 338 is turned off, in response to a command signal for operating the first bit line BL1 of the first cell array. For this, if the third and fourth switching elements SW3 and SW4 are NMOS transistors, the high voltage V_high is applied to a gate of the third switching element SW3 and the ground voltage GND is applied to a gate of the fourth switching element SW4. As a result, the first set bias Vset1 from the first bias output unit 3361 is transferred to the first bit line BL1 via the third switching element SW3.

When the data is written into the first memory cell M1 coupled to the first bit line BL1, a ground voltage GND may be applied to a selected word line WL coupled to the first memory cell M1.

As a result, the first set bias Vset1 is applied to the first memory cell M1 through the first bit line BL1, and thus a resistance state of the first memory cell M1 is changed to a low resistance state. Therefore, '0' data is stored in the first memory cell M1 of the first cell array.

Referring to FIG. 5B, when a high voltage V_high is applied to the input node of the CMOS circuit of the column controller 332 in response a command signal for writing '1' data, the reset pulse of a low voltage V_low is transferred to the memory selector 334.

The first switching element SW1 of the memory selector 334 is turned on and the second switching element SW2 of the memory selector 334 is turned off, in response to a command signal for operating the first cell array. Therefore, the reset pulse from the column controller 332 is transferred to the first bias output unit 3361 via the first switching element SW1.

When the reset pulse of the low voltage V_low is applied to the input node of the CMOS circuit of the first bias output unit 3361, the PMOS transistor is turned on, and thus the first reset bias Vreset1 is transferred to the bit line selector 338.

The third switching element SW3 of the bit line selector 338 is turned on and the fourth switching element SW4 of the bit line selector 338 is turned off, in response to a command signal for operating the bit line BL1 of the first cell array. Therefore, the first reset bias Vreset1 from the first bias output unit 3361 is transferred to the first bit line BL1 via the third switching element SW3.

As a result, the first reset bias Vreset1 is applied to the first memory cell M1 through the first bit line BL1, and thus a resistance state of the first memory cell M1 is changed to a high resistance state. Therefore, '1' data is stored in the first memory cell M1 of the first cell array.

Referring to FIG. 5C, when the ground voltage GND is applied to the input node of the CMOS circuit of the column controller 332 in response to a command signal for writing '0' data, the set pulse of the high voltage V_high is transferred to the memory selector 334.

The first switching element SW1 of the memory selector 334 is turned off and the second switching element SW2 of the memory selector 334 is turned on, in response to a command signal for operating the second cell array. Therefore, the set pulse transferred from the column controller 332 is transferred to the second bias output unit 3362 via the second switching element SW2.

When the high voltage V_high is applied to the input node of the CMOS circuit of the second bias output unit 3362, the NMOS transistor is turned on, and thus the second set bias Vset2 is transferred to the bit line selector 338.

The third switching element SW3 of the bit line selector 338 is turned off and the fourth switching element SW4 of the bit line selector 338 is turned on, in response to a command signal for operating the second bit line BL2 of the second cell array. Therefore, the second set bias Vset2 from the second bias output unit 3362 is transferred to the second bit line BL2 via the fourth switching element SW4.

As a result, the second set bias Vset2 is applied to the second memory cell M2 through the second bit line BL2, and thus a resistance state of the second memory cell M2 is changed to a low resistance state. Therefore, '0' data is stored in the second memory cell M2 of the second cell array.

Referring to FIG. 5D, when the high voltage V_high is applied to the input node of the CMOS circuit of the column controller 332 in response to a command signal for writing '1' data, the reset pulse of the low voltage V_low is transferred to the memory selector 334.

The first switching element SW1 of the memory selector 334 is turned off and the second switching element SW2 of the memory selector 334 is turned on, in response to a command signal for operating the second cell array. Therefore, the reset pulse from the column controller 332 is transferred to the second bias output unit 3362 via the second switching element SW2.

When the low voltage V_low is applied to the input node of the CMOS circuit of the second bias output unit 3362, the PMOS transistor is turned on, and thus the second reset bias Vreset2 is transferred to the bit line selector 338.

The third switching element SW3 of the bit line selector 338 is turned off and the fourth switching element SW4 of the bit line selector 338 is turned on, in response to a command signal for operating the second bit line BL2 of the second cell array. Therefore, the second reset bias Vreset2 from the second bias output unit 3362 is transferred to the second bit line BL2 via the fourth switching element SW4.

As a result, the second reset bias Vreset2 is applied to the second memory cell M2 through the second bit line BL2, and thus a resistance state of the second memory cell M2 is changed to a high resistance state. Therefore, '1' data is stored in the second memory cell M2 of the second cell array.

The embodiments illustrated in FIGS. 4 to 5D show a memory cell block including a pair of bit lines and a pair of memory cells coupled to the bit lines for illustrative convenience. However, the memory cell block may include a plurality of pairs of bit lines and a plurality of pairs of memory cells coupled to the pairs of bit lines. Embodiments in which two pairs of bit lines and two pairs of memory cells are disposed in a memory cell block will be described with reference to FIGS. 6A and 6B.

Figure 6A:
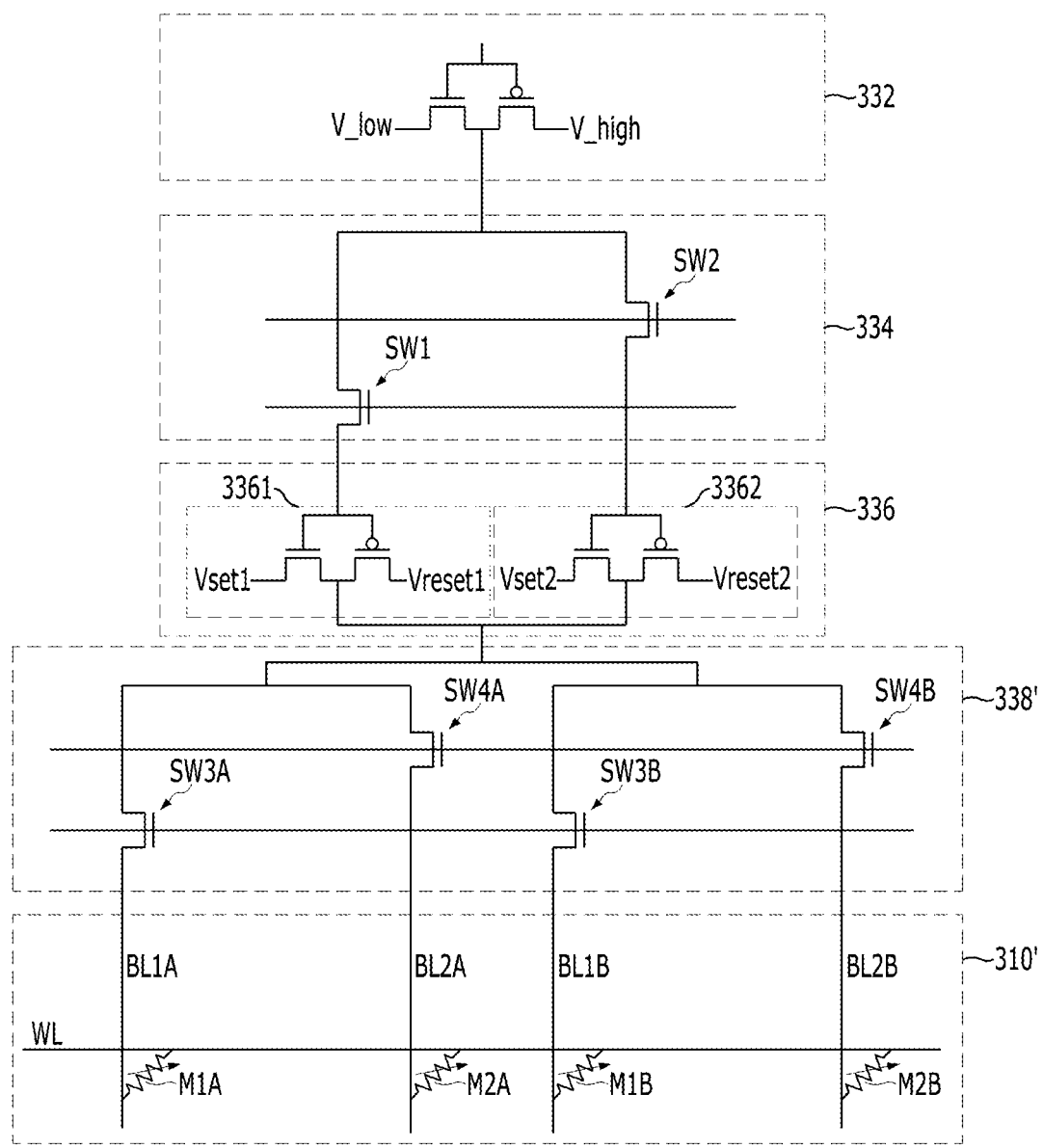
FIG. 6A illustrates a column control block in accordance with an embodiment of the present disclosure.

FIG. 6A illustrates a memory cell block including two pairs of bit lines and two pairs of memory cells in accordance with an embodiment. In this embodiment, a first pair of a first bit line and a second bit line, and a first pair of a first memory cell and a second memory cell, coupled thereto are represented by 'BL1A', 'BL2A', 'M1A' and 'M2A', respectively. A second pair of a first bit line and a second bit line, and a second pair of a first memory cell and a second memory cell, coupled thereto respectively, are represented by 'BL1B', 'BL2B', 'M1B' and 'M2B', respectively.

In an embodiment, a column controller 332, a memory selector 334, and a write driver 336 of FIG. 6A are substantially the same as those of FIG. 4.

A bit line selector 338' includes a first pair of a third switching element SW3A and a fourth switching element SW4A, coupled to the first pair of the first and second bit lines BL1A and BL2A, respectively, and a second pair of a third switching element SW3B and a fourth switching element SW4B coupled to the second pair of the first and second bit lines BL1B and BL2B, respectively. An input node of the first pair of the third and fourth switching elements SW3A and SW4A and an input node of the second pair of the third and fourth switching elements SW3B and SW4B are commonly connected to an output node of the write driver 336.

The third and fourth switching elements SW3A, SW4A, SW3B and SW4B are selectively turned on in response to a command signal which selects one of the first bit lines BL1A and BL1B of a first cell array and the second bit lines BL2A and BL2B of a second cell array. The third switching elements SW3A and SW3B are turned on when the first bit lines BL1A and BL1B of the first cell array of a memory cell block 310' are selected, and transfer the first set bias Vset1 or the first reset bias Vreset1 to the first bit lines BL1A and BL1B. On the other hand, the fourth switching elements SW4A and SW4B are turned on when the second bit lines BL2A and BL2B of the second cell array of the memory cell block 310' are selected, and transfer the second set bias Vset2 or the second reset bias Vreset2 to the second bit lines BL2A and BL2B. When the third and fourth switching elements SW3A, SW4A, SW3B and SW4B include transistors, gates of the third switching elements SW3A and SW3B are connected to each other, and gates of the fourth switching elements SW4A and SW4B are connected to each other.

Figure 6B:
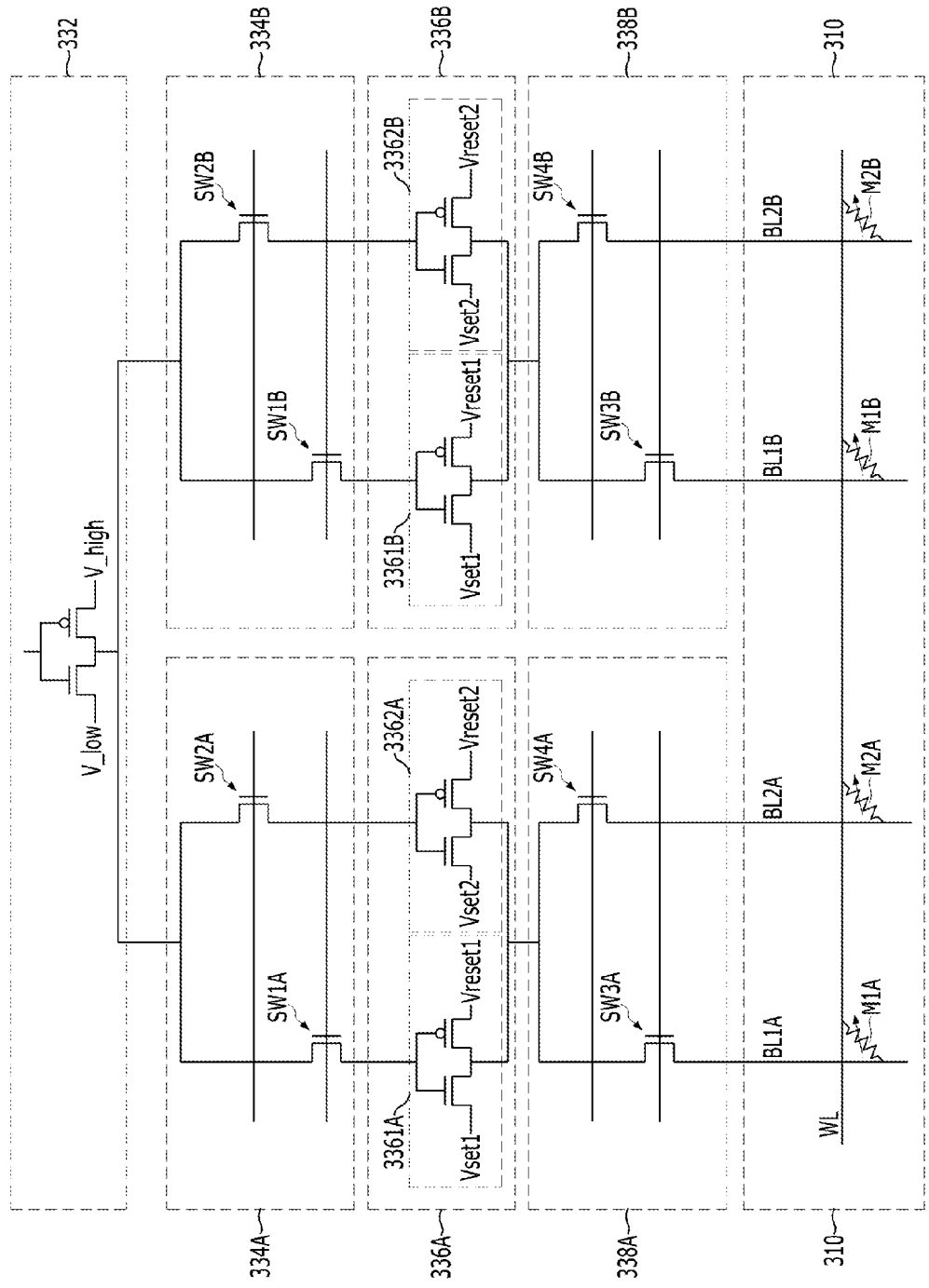
FIG. 6B illustrates a column control block in accordance with an embodiment of the present disclosure.

FIG. 6B illustrates a memory cell block including two pairs of bit lines and two pairs of memory cells in accordance with another embodiment.

In an embodiment, a column controller 332 is substantially the same as that of FIG. 6A.

A bit line selector includes a first bit line selector 338A and a second bit line selector 338B. The first bit line selector 338A includes a first pair of a third switching element SW3A and a fourth switching element SW4A coupled to a first pair of a first bit line BL1A and second bit line BL2A, respectively. The second bit line selector 338B includes a second pair of a third switching element SW3B and a fourth switching element SW4B coupled to a second pair of a first bit line BL1B and a second bit line BL2B, respectively. Input nodes of the first pair of the third and fourth switching elements SW3A and SW4A are commonly connected to an output node of a first write driver 336A, and input nodes of the second pair of the third and fourth switching elements SW3B and SW4B are commonly connected to an output node of a second write driver 336B. In an embodiment, when the third and fourth switching elements SW3A, SW4A, SW3B and SW4B include transistors, gates of the third switching elements SW3A and SW3B are separated from each other, and gates of the fourth switching elements SW4A and SW4B are separated from each other, unlike in the bit line selector 338' of FIG. 6A.

Each of the first write driver 336A and the second write driver 336B may have substantially the same configuration as the write driver 336 of FIG. 6A. The first write driver 336A is connected to the first bit line selector 338A and outputs a selected one of the first set bias Vset1, the first reset bias Vreset1, the second set bias Vset2 and the second reset bias Vreset2 to the first bit line selector 338A, and the second write driver 336B is connected to the second bit line selector 338B and outputs a selected one of the first set bias Vset1, the first reset bias Vreset1, the second set bias Vset2 and the second reset bias Vreset2 to the second bit line selector 338B.

A first memory selector 334A includes a first switching element SW1A connected to a first bias output unit 3361A of the first write driver 336A and a second switching element SW2A connected to a second bias output unit 3362A of the first write driver 336A. A second memory selector 334B includes a first switching element SW1B connected to a first bias output unit 3361B of the second write driver 336B and a second switching element SW2B connected to a second bias output unit 3362B of the second write driver 336B. When the first and second switching elements SW1A, SW2A, SW1B and SW2B include transistors, gates thereof are separated from each other Some features of an embodiment as shown in FIG. 6B are different from those of an embodiment as shown in FIG. 6A. For example, components controlling the first pair of the first and second bit lines BL1A and BL2A, that is, the first bit line selector 338A, the first write driver 336A and the first memory selector 334A, are separate from and operate independently of components controlling the second pair of the first and second bit lines BL1B and BL2B, that is, the second bit line selector 338B, the second write driver 336B and the second memory selector 334B. Therefore, in embodiments in accordance with FIG. 6A, different types of memory cells included in different pairs in a memory cell block cannot operate simultaneously while the same type of memory cells included in different pairs operate simultaneously. That is, in embodiments in accordance with FIG. 6A, a write bias cannot be supplied to the first memory cells M1A and M1B at the same time that a write bias is supplied to the second memory cells M2A and M2B.

On the other hand, in embodiments in accordance with FIG. 6B, the same type of memory cells included in different pairs can operate simultaneously. Moreover, different types of memory cells included in different pairs in a memory cell block can operate simultaneously since the different pairs, e.g., the first pair of the first and second memory cells M1A and M2A and the second pair of the first and second memory cells M1B and M2B, are separately controlled. For example, in embodiments in accordance with FIG. 6B, it is possible to supply a write bias to the first memory cell M1A included in the first pair by turning on the first switching element SW1A of the first memory selector 334A and the third switching element SW3A of the first bit line selector 338A, and, at the same time, to supply a write bias to the second memory cell M2B included in the second pair by turning on the second switching element SW2B of the second memory selector 334B and the fourth switching element SW4B of the second bit line selector 338B.

Figure 7:
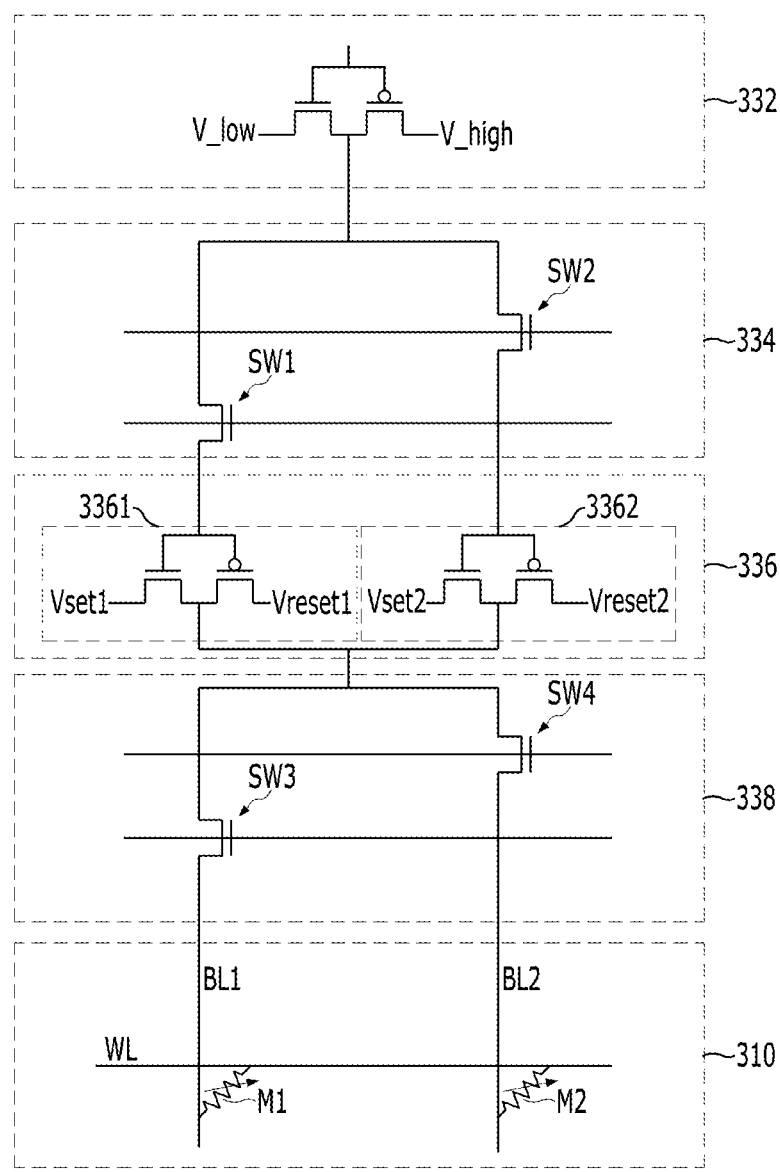
FIG. 7 illustrates a column control block of in accordance with an embodiment of the present disclosure.

FIG. 7 illustrates a column control block in accordance with an embodiment. Unlike embodiments in accordance with FIG. 4, a first bias output unit 3361 and a second bias output unit 3362 of a write driver 336 output the same set bias and the same reset bias. However, levels of the set bias and the reset bias may be adjusted using third and fourth switching elements SW3 and SW4 of a bit line selector 338, thereby obtaining different biases provided to the first and second memory cells M1 and M2.

Referring to FIG. 7, the first bias output unit 3361 and the second bias output unit 3362 output the same write biases, for example, the first set bias Vset1 and the first reset bias Vreset1 are the same. In another embodiment, the first bias output unit 3361 and the second bias output unit 3362 may output the second set bias Vset2 and the second reset bias Vreset2 instead of the first bias Vset1 and the first reset bias Vreset1.

When the first set bias Vset1 or the first reset bias Vreset1 is applied thereto, the first memory cell M1 may be normally switched. However, the second memory cell M2 cannot be switched properly because the first set bias Vset1 and the first reset bias Vreset1 are not suitable to switch the resistance state of the second memory cell M2. To address this issue, the third and fourth switching elements SW3 and SW4 may be used.

If levels of the second set bias Vset2 and the second reset bias Vreset2, which are used to control a resistance state of the second memory cell M2, are smaller than those of the first set bias Vset1 and the first reset bias Vreset1, respectively, the levels of the first set bias Vset1 and the first reset bias Vreset1 to be transferred to the second memory cell M2 are reduced to normally operate the second memory cell M2. The third and fourth switching elements SW3 and SW4 may be configured to reduce a level of a bias passing through the fourth switching element SW4 compared to a level of a bias passing through the third switching element SW3.

Figure 8:
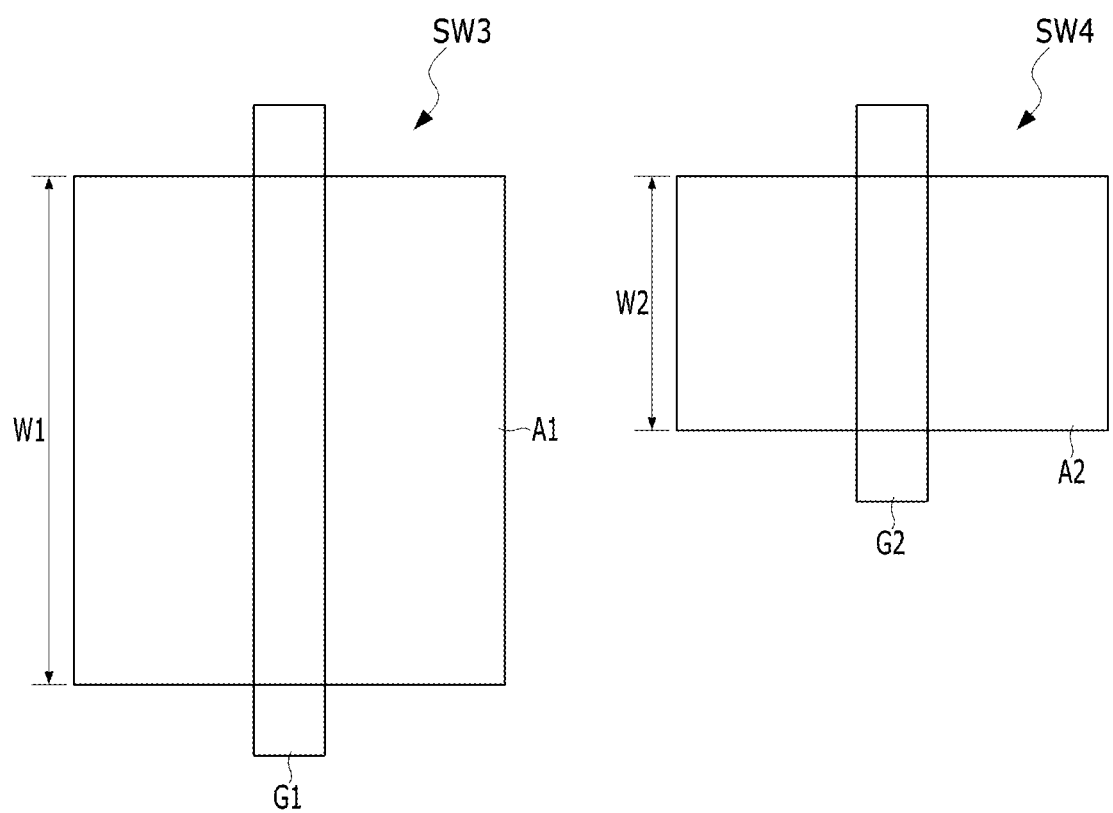
FIG. 8 illustrates a plan view of third and fourth switching elements of FIG. 7.

In an embodiment, as shown in FIG. 8, when the third switching element SW3 is a transistor including a first active region A1 and a first gate G1 crossing the first active region A1, and the fourth switching element SW4 is a transistor including a second active region A2 and a second gate G2 crossing the second active region A2, a width W2 of the second active region A2 is smaller than a width W1 of the first active region A1 in a direction along which the first and second gates G1 and G2 extend. That is, the fourth switching element SW4 has smaller drivability than that of the third switching element SW3 because of a difference between the width W2 and the width W1. As a result, the level of the bias passing through the fourth switching element SW4 is reduced by the smaller drivability of the fourth switching element. A bias having a lower level than the first set bias Vset1 or the first reset bias Vreset1 is supplied to the second memory cell M2.

On the other hand, if the levels of the second set bias Vset2 and the second reset bias Vreset2, which are used to control the resistance state of the second memory cell M2, are larger than those of the first set bias Vset1 and the first reset bias Vreset1, respectively, the levels of the first set bias Vset1 and the first reset bias Vreset1 to be transferred to the second memory cell M2 are increased to normally operate the second memory cell M2. The third and fourth switching elements SW3 and SW4 may be configured to increase a level of a bias passing through the fourth switching element SW4 compared to a level of a bias passing through the third switching element SW3. Thus, in an embodiment, in contrast to the embodiment shown in FIG. 8, the width W2 of the second active region A2 may be larger than the width W1 of the first active region A1. In sum, a targeted bias having a level corresponding to a level of the second set bias Vset2 or the second reset bias Vreset2 may be supplied to the second memory cell M2 by modifying the width W2 of the second active region A2 of the fourth switching element SW4.

In another embodiment, since the first bias output unit 3361 and the second bias output unit 3362 output the same biases, one of the first bias output unit 3361 and the second bias output unit 3362 may be omitted. In addition, one of the first and second switching elements SW1 and SW2, which is coupled to the omitted bias output unit, may be omitted. In this embodiment, when any one of the first cell array and the second cell array is selected, a memory selector including a single switching element is turned on to transfer the high voltage V-high or the low voltage V_low to the write driver 336 including a single bias output unit.

Meanwhile, the first memory cell M1 and/or the second memory cell M2 may include a selection element. The selection element may be coupled to a variable resistance layer and control the supply of a voltage or current to the variable resistance layer.

Figure 9:
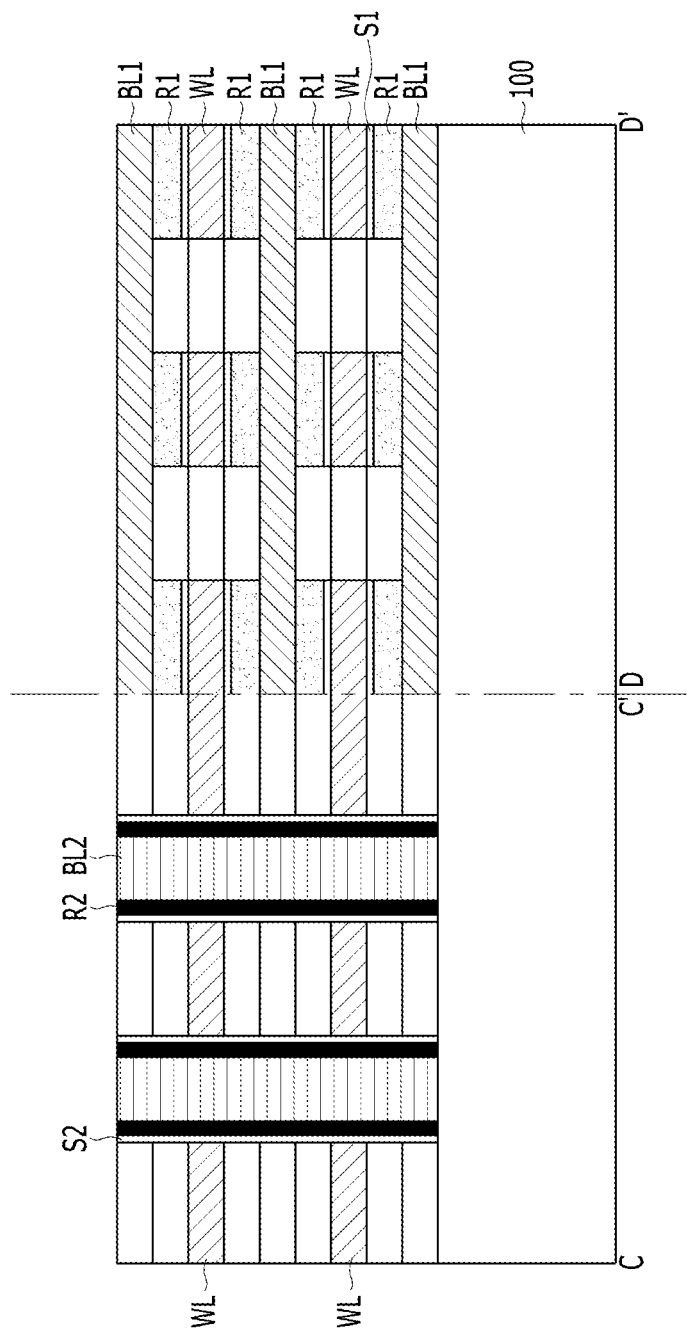
FIG. 9 is a cross-sectional view illustrating a memory cell block in accordance with another embodiment of the present disclosure.

FIG. 9 is a cross-sectional view illustrating a memory cell block in accordance with another embodiment of the present disclosure.

Referring to FIG. 9, a first cell array of the memory cell block further includes a first selection element layer S1 interposed between a first variable resistance layer R1 and a word line WL. The first selection element layer S1 may block a current flow at a voltage lower than a certain threshold voltage while allowing a gradually increasing current to flow at a voltage higher than the threshold voltage. The first selection element layer S1 may include any of a diode, a transistor, a varistor, a metal-insulator transition (MIT) element, a tunnel barrier formed of an insulating material, and the like. In another embodiment, the first selection element layer S1 may be interposed between a first bit line BL1 and the first variable resistance layer R1.

A second cell array of the memory cell block further includes a second selection element layer S2 interposed between a second variable resistance layer R2 and the word line WL. The second selection element layer S2 may perform substantially the same function as that of the first selection element layer S1 and be formed of various materials. In another embodiment, the second selection element layer S2 may be interposed between a second bit line BL2 and the second variable resistance layer R2.

Figure 10:
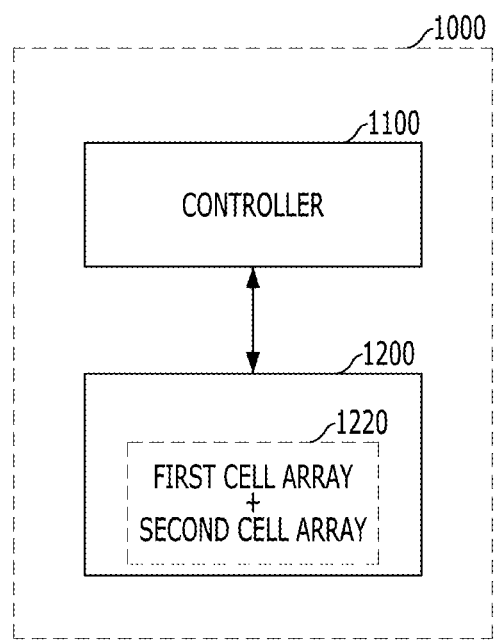
FIG. 10 illustrates an electronic device including a memory device in accordance with an embodiment of the present disclosure.

The above-described memory devices may be used in various devices or systems. FIG. 10 shows an example of a device or system including one or more of the above-described memory devices.

FIG. 10 illustrates an electronic device 1000 including a memory device in accordance with an embodiment of the present disclosure.

The electronic device 1000 may be a device or a system which performs various functions including a function of storing data. The electronic device 1000 may be a data storage device such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like, or may be an electronic device such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, or the like.

Referring to FIG. 10, the electronic device 1000 includes a memory unit 1200 for storing data and a controller 1100 for controlling the memory unit 1200.

The memory unit 1200 may include one or more of memory devices in accordance with embodiments of the present disclosure. In an embodiment, the memory unit 1200 includes a memory cell block 1220 in which first and second cell arrays including different types of variable resistance elements are disposed, and a peripheral circuit (not shown) for independently controlling operations of reading and writing data from and into the first and second cell arrays.

The memory unit 1200 may include a column control block and a memory cell block, which includes a first cell array and a second cell array. The first cell array includes a word line, a first bit line crossing the word line and a first variable resistance layer interposed between the word line and the first bit line. The second cell array includes the word line, a second bit line crossing the word line and the first bit line, and a second variable resistance layer interposed between the word line and the second bit line. The second variable resistance layer is formed of a material different from that of the first variable resistance layer. The column control block may supply a first write bias for switching a resistance state of the first variable resistance layer to the first bit line, and supply a second write bias for switching a resistance state of the second variable resistance layer to the second bit line. Through this, it is possible to form the memory unit 1200 performing multiple functions. In an embodiment, when a first memory cell of the first cell array stores a large amount of user data and a second memory cell of the second cell array stores data subsidiarily or temporarily in order to efficiently input and output data to and from a memory, the memory unit 1200 may be used as a memory by operating the first cell array or a buffer memory by operating the second cell array. That is, the memory unit 1200 may be selectively used as a memory or a buffer memory.

As described above, since a multi-functional memory unit 1200 is implemented, it is possible to increase a degree of integration, reduce power consumption and size, improve characteristics, and so on, in the memory unit 1200. As a result, it is also possible to increase a degree of integration, reduce power consumption and size, improve performance, and so on, in the electronic device 1000.

The electronic device 1000 may further include one or more of various functional units such as an interface unit, a communication unit, a display unit, a processing unit, and so on, depending on their types.

While the present disclosure provides a description of embodiments, these should not be construed as limitations on the scope of any invention that may be claimed, but rather as descriptions of features that may be specific to particular embodiments of particular inventions. Certain features that are described in the present disclosure in the context of separate embodiments can also be implemented in combination in a single embodiment. Various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be depicted in the drawings in a particular order, this should not be understood as requiring that such operations be performed in the particular order shown or in sequential order, or that all illustrated operations be performed, to achieve desirable results. Moreover, the separation of various system components in the embodiments described in the present disclosure should not be understood as requiring such separation in all embodiments.

The present disclosure describes implementations and examples of embodiments. Other implementations, enhancements and variations can be made based on what is described and illustrated in the present disclosure.

What is claimed is:

1. An electronic device comprising semiconductor memory, wherein the semiconductor memory comprises:
   a memory cell block including a first cell array and a second cell array,
   wherein the first cell array includes a word line, a first bit line crossing the word line, and a first variable resistance layer disposed between the word line and the first bit line, and
   wherein the second cell array includes the word line, a second bit line crossing the word line and the first bit line, and a second variable resistance layer disposed between the word line and the second bit line, the second variable resistance layer including a material different from that of the first variable resistance layer, the word line being shared by the first and second cell arrays; and
   a column control block configured to supply a first write bias for switching a resistance state of the first variable resistance layer to the first bit line and to supply a second write bias for switching a resistance state of the second variable resistance layer to the second bit line.

2. The electronic device of claim 1, wherein the word line extends in a first direction which is parallel to a surface of a substrate, wherein the first bit line extends in a second direction which is parallel to the surface of the substrate and crosses the first direction, the first bit line being disposed at a level that is different from the word line in a third direction perpendicular to the surface of the substrate, and wherein the second bit line extends in the third direction, and is disposed in a region defined by two adjacent word lines disposed at a first level in the third direction and two adjacent first bit lines disposed at a second level in the third direction.

3. The electronic device of claim 1, wherein the first variable resistance layer includes a phase change material in which a resistance state is changed depending on a degree of crystallization, and wherein the second variable resistance layer includes a metal oxide in which a resistance state corresponds to a presence or absence of a conductive path.

4. The electronic device of claim 1, wherein the column control block is configured to simultaneously supply the first write bias and the second write bias.

5. The electronic device of claim 1, wherein the column control block is configured to selectively supply the first write bias and the second write bias.

6. The electronic device of claim 1, wherein the first and second bit lines correspond to a first pair of bit lines including the first bit line and the second bit line, and wherein the column control block comprises:
a column controller configured to output a set pulse or a reset pulse depending on data to be written to a memory cell in the memory cell block;
a first write driver including a first bias output unit configured to output the first write bias and a second bias output unit configured to output the second write bias, and configured to output one of the first write bias and the second write bias in response to an output of the column controller;
a first memory selector configured to transfer the output of the column controller to one of the first bias output unit and the second bias output unit, and disposed between the column controller and the first write driver; and
a first bit line selector configured to transfer an output of the first write driver to one of the first and second bit lines in the first pair, and disposed between the first write driver and the memory cell block.

7. The electronic device of claim 6, wherein the first memory selector includes a first switching element, which controls a connection between the first bias output unit and the column controller, and a second switching element, which controls a connection between the second bias output unit and the column controller, and wherein the first bit line selector includes a third switching element, which controls a connection between the first write driver and the first bit line, and a fourth switching element, which controls a connection between the first write driver and the second bit line.

8. The electronic device of claim 7, wherein a first group of the first and third switching elements and a second group of the second and fourth switching elements are selectively turned on.

9. The electronic device of claim 6, wherein the memory cell block further comprises a second pair of bit lines including another first bit line and second bit line, wherein the first bit line selector is configured to transfer the output of the first write driver to one of the first and second bit lines in the second pair, and wherein the output of the first write driver is transferred to the first bit lines in the first and second pairs or the second bit lines in the first and second pairs.

10. The electronic device of claim 9, wherein the first bit line selector includes a first pair of switching elements including a third switching element and a fourth switching element which control a connection between the first write driver and the first bit line of the first pair and a connection between the first write driver and the second bit line of the first pair, respectively, and a second pair of switching elements including a third switching element and a fourth switching element which control a connection between the first write driver and the first bit line of the second pair and a connection between the first write driver and the second bit line of the second pair, respectively.

11. The electronic device of claim 10, wherein the third switching elements of the first and second pairs are controlled together, and wherein the fourth switching elements of the first and second pairs are controlled together.

12. The electronic device of claim 6, wherein the memory cell block further comprises a second pair of bit lines including another first bit line and second bit line, and wherein the column control block further comprises:
a second write driver including a third bias output unit configured to output the first write bias and a fourth bias output unit configured to output the second write bias, and configured to output one of the first write bias and the second write bias in response to the output of the column controller;
a second memory selector configured to transfer the output of the column controller to one of the third bias output unit and the fourth bias output unit of the second write driver, and disposed between the column controller and the second write driver; and
a second bit line selector configured to transfer an output of the second write driver to one of the first and second bit lines in the second pair, and disposed between the second write driver and the memory cell block.

13. The electronic device of claim 12, wherein the first bit line selector includes a first pair of switching elements including a third switching element and a fourth switching element which control a connection between the first write driver and the first bit line of the first pair and a connection between the first write driver and the second bit line of the first pair, respectively, and wherein the second bit line selector includes a second pair of switching elements including a third switching element and a fourth switching element which control a connection between the second write driver and the first bit line of the second pair and a connection between the second write driver and the second bit line of the second pair, respectively.

14. The electronic device of claim 13, wherein the third switching elements of the first and second pairs are controlled independently, and wherein the fourth switching elements of the first and second pairs are controlled independently.

15. The electronic device according to claim 1, wherein the column control block comprises:

a column controller configured to output a set pulse or a reset pulse depending on data to be written to a memory cell in the memory cell block;

a write driver configured to output the first write bias in response to an output of the column controller;

a memory selector configured to transfer the output of the column controller to the write driver, and disposed between the column controller and the write driver; and a bit line selector configured to transfer the first write bias to the first bit line or transfer a modified first write bias, which has a voltage level modified from the first write bias, to the second bit line, and disposed between the write driver and the memory cell block, the modified first write bias corresponding to the second write bias.

16. The electronic device according to claim 15, wherein the bit line selector includes a first transistor, which controls a connection between the write driver and the first bit line, and a second transistor, which controls a connection between the write driver and the second bit line, and wherein a width of an active region of the first transistor is different from that of the second transistor.

17. The electronic device according to claim 1, wherein the memory cell block further includes a selection element disposed between the first variable resistance layer and the first bit line or between the first variable resistance layer and the word line, the selection element controlling the supply of a voltage or current to the first variable resistance layer.

18. The electronic device according to claim 1, wherein the memory cell block further includes a selection element disposed between the second variable resistance layer and the second bit line or between the second variable resistance layer and the word line, the selection element controlling the supply of a voltage or current to the second variable resistance layer.

19. The electronic device according to claim 1, wherein the semiconductor memory selectively serves as a memory storing a user data when the first cell array operates and a buffer memory for temporarily storing data that is read out of or to be written into a memory when the second cell array operates.

* * * * *